United States Patent [19]

Kislovski

[11] Patent Number: 4,785,389
[45] Date of Patent: Nov. 15, 1988

[54] ASTABLE, MAGNETICALLY COUPLED MULTIVIBRATOR

[75] Inventor: André Kislovski, Bern, Switzerland

[73] Assignee: Hasler AG, Bern, Switzerland

[21] Appl. No.: 93,799

[22] Filed: Sep. 8, 1987

Related U.S. Application Data

[63] Continuation-in-part of Ser. No. 53,367, May 1, 1987.

[30] Foreign Application Priority Data

Sep. 5, 1986 [CH] Switzerland ............... 03574/86

[51] Int. Cl.$^4$ .......................................... H02M 7/537
[52] U.S. Cl. ....................................... 363/132; 363/98;
323/253; 323/307; 323/335; 323/338
[58] Field of Search ................ 363/17, 75, 82, 90,
363/91, 93, 98, 132; 323/250, 251, 253, 307,
310, 332, 335, 338, 355

[56] References Cited

U.S. PATENT DOCUMENTS

| 4,164,014 | 8/1979 | Crowe et al. ............... | 363/132 X |
| 4,319,316 | 3/1982 | Farrer et al. .............. | 363/132 X |
| 4,553,070 | 11/1985 | Sairanen et al. ........... | 363/132 X |
| 4,603,378 | 7/1986 | Virta ....................... | 363/132 X |

*Primary Examiner*—Peter S. Wong
*Attorney, Agent, or Firm*—Horst M. Kasper

[57] ABSTRACT

A multivibrator circuit is provided having two power capacitors C1 and C2 in a power part, a primary winding N1 of a transformer T, as well as two switching transistors Q1 and Q2, and two diodes D3, D4. A positive feedback coupling is provided via the transformer winding N2 and the base resistor RB. The automatic frequency control is switched by an electrically contollable inductive component 10, which is connected in parallel to the transformer winding N2 and the base resistor RB. The component 10 comprises a control winding 17 which jointly surrounds two identical annular cores 11, 12 and comprises an induction winding 15, which comprises a series connection of two partial windings. The partial windings individually wind around one of the ring cores 11, 12. The linearly-acting inductivity L for the current i, running through the induction winding 15, can be varied via a control current i over a wide range (1:100).

20 Claims, 2 Drawing Sheets

ASTABLE, MAGNETICALLY COUPLED MULTIVIBRATOR

CROSS-REFERENCE TO RELATED APPLICATIONS

This application is a continuation-in-part application of another application filed May 1, 1987 and bearing Ser. No. 053,367. The entire disclosure of this application, including the drawings thereof, is hereby incorporated in this application as if fully set forth herein.

BACKGROUND OF THE INVENTION

1. Field of the Invention

The invention relates to an astable, magnetically coupled multivibrator including two power capacitors, which are connected in series to an input voltage and which can be alternatingly shorted via two switching transistors and via a transformer winding.

2. Brief Description of the Background of the Invention Including Prior Art

A Series 6500 A of eight feed power supply models is known from R. Myers and R. D. Peck, 200 kHz Power FET Technology in New Modular Power Supplies, HEWLETT-PACKARD Journal (August 1981), pages 3 to 7 and 10. These models provide a power of 50 watt direct current at 5, 12, 15, and 18 volt output voltage. The electrical construction of these components corresponds to switch-controlled power converters, which contain a multivibrator in a feedback circuit and where the frequency of the multivibrator is controlled. The multivibrator exhibits two MOSFET transistors which are switched precisely counter-cyclically, as well as two solid capacitors, a transformer, and a base resistor.

The frequency is controlled via the variable inductivity L of an electrically controllable inductor. This is a control coil with two E-shaped cores, which are operated according to the method of the saturation control. In this case, the control winding is disposed on the center web and the induction winding is provided as two individual windings connected in series and placed on the two outer webs of the cores. The core material has the property of a very high permeability and the magnetic flux densities in the two outer webs are maintained always in balance because of the low control current. (W. Seipel, Magnetic Components for High-Frequency Switching Power Supplies, HEWLETT-PACKARD Journal (August 1981), pages 8 and 9.)

An effort has been undertaken in the construction of the recited inductor to minimize the most disadvantageous properties of control throttle coils with saturation control (or, respectively, current-limiting controls or, respectively, saturation angle controls) (as known for example from H. Krakowski, The Magnetic Control Technique and its Application in the Power Supply Plants of the Federal German Post Office, Der Fernmeldeingenieur, Volume 8, Issue 7 (July 15, 1954), pp. 1 ff). This has certainly succeeded in part. Nevertheless, this inductor has remained the critical element in the power supply apparatus of the Series 6500 A.

SUMMARY OF THE INVENTION

1. Purposes of the Invention

It is an object of the present invention to provide an improved electric control for power supplies.

It is a further object of the present invention to furnish an electrically controllable inductor for the control of power supplies.

It is yet another object of the present invention to provide a power supply based on inductive control, which is insensitive against electrical and mechanical disturbances, and which is robust and economically attractive.

These and other objects and advantages of the present invention will become evident from the description which follows.

2. Brief Description of the Invention

The objects of the invention are achieved by employing some of the techniques which have been recited in the parent application Nos. 053,367 and PCT/CH86/00124.

The invention provides a magnetically coupled multivibrator circuit. A first power capacitor is connected on one side to the first power input terminal. A second power capacitor is connected on one side to the second power input terminal and connected on a second side to a second side of the first power capacitor. A first switching transistor has associated two rectifying electrodes including emitter and collector and has a base. A first rectifying electrode of the first switching transistor is connected to the first side of the first power capacitor. A second switching transistor has two rectifying electrodes including emitter and collector and has a base. A first rectifying electrode of the second switching transistor is connected to the first side of the second power capacitor. A first transformer winding is connected at a first end to the second side of the first power capacitor and to the second side of the second power capacitor and is connected at a second end to a second rectifying electrode of the first switching transistor and to a second rectifying electrode of the second switching transistor. A series connection of an ohmic resistance and of a second transformer winding is connected at a first end to the second rectifying electrode of the first switching transistor and to the second rectifying electrode of the second switching transistor and is connected at a second end to the base of the first switching transistor and to a base of the second switching transistor.

A current controlled inductor is connected in parallel to the series connection for setting the frequency of the multivibrator. The inductor is an electronic component which can be controlled by a control current and which inductor comprises two ferromagnetic cores. The two ferromagnetic cores are independent of each other. The two ferromagnetic cores have the same properties and are disposed coaxially relative to each other and are formed as a ring each closed in itself. A control winding winds around the two ferromagnetic cores jointly. An induction winding, which forms two partial windings connected in series, and which winds around the two ferromagnetic cores in each case separately. The sense of direction of the control winding and of the partial windings is such that currents passing through the control winding and the partial windings generate magnetic fluxes in the cores such that the magnetic fluxes are of the same direction in one of the cores and in opposite direction in a second one of the ferromagnetic cores. The functional dependence of a magnetic flux density in a core on the magnetic field strength in that core exhibits a course for the core material employed. This course exhibits, over its full region, an about uniform curvature and no saturation bend. The core is of a soft magnetic material and thereby a course is present which is substantially identical for increasing and decreasing field strength, where there are two magnetic field strength values such that the ratios of the slope of the course is at least ratio of 1 to 100.

The induction winding can be connected in parallel to the series connection of the second transformer winding and of the ohmic resistance. The electronic component with its induction winding can be connected in parallel to the series connection of the first transformer winding, of the second transformer winding, and of the ohmic resistor.

A first ohmic resistor can have two terminals and be connected with a first terminal to the first side of the first power capacitor and to the first rectifying electrode of the first switching transistor. A second ohmic resistor can have two terminals and can be connected with a first terminal to the first side of the second power capacitor and to the first rectifying electrode of the second switching transistor. The two ohmic resistors are provided for the purpose of building up oscillations of the multivibrator circuit. The ohmic resistors are connected in series to the input voltage via the emitter base sequence of the two switching transistors. A second diode can be furnished where the first and second diode are connected in parallel to the first and second capacitor and which diodes connect the emitters of these two transistors to each other.

A first ohmic resistor can have two terminals and can be connected with a first terminal to the first side of the first power capacitor and to the first rectifying electrode of the first switching transistor. A second ohmic resistor can have two terminals and can be connected with a first terminal to the first side of the second power capacitor and to the first rectifying electrode of the second switching transistor, where the two ohmic resistors are provided for the purpose of building up oscillations of the multivibrator circuit and which ohmic resistors are connected in series to the input voltage via the emitter base sequence of the two switching transistors. A first diode can have two terminals and can be connected with a first terminal to the second rectifying electrode of the first transistor and connected with a second terminal to the first terminal of the series connection. A second diode can have two terminals and can be connected with a first terminal to the second rectifying electrode of the first transistor and connected with a second terminal to the first terminal of the series connection.

A first ohmic resistor can have two terminals and can be connected with a first terminal to the first side of the first power capacitor and to the first rectifying electrode of the first switching transistor and connected with a second terminal to the second rectifying electrode of the second transistor. A second ohmic resistor can have two terminals and can be connected with a first terminal to the first side of the second power capacitor and to the first rectifying electrode of the second switching transistor and can be connected with a second terminal to the second rectifying electrode of the first transistor, where the two ohmic resistors are provided for the purpose of building up oscillations of the multivibrator circuit. A first diode having two terminals and can be connected with a first terminal to the second rectifying electrode of the first transistor and can be connected with a second terminal to the first terminal of the series connection. A second diode can have two terminals and can be connected with a first terminal to the second rectifying electrode of the first transistor and can be connected with a second terminal to the first terminal of the series connection.

A first ohmic resistor can have two terminals and can be connected with a first terminal to the first side of the first power capacitor and to the first rectifying electrode of the first switching transistor and can be connected with a second terminal to the second rectifying electrode of the second transistor. A second ohmic resistor can have two terminals and can be connected with a first terminal to the first side of the second power capacitor and with a second terminal to the first rectifying electrode of the second switching transistor and can be connected with a second terminal to the second rectifying electrode of the first transistor. The two ohmic resistors can be provided for the purpose of building up oscillations of the multivibrator circuit. A third capacitor can have two terminals and can be connected with a first terminal to the second rectifying electrode of the first transistor and can be connected with a second terminal to the first terminal of the series connection. A fourth capacitor can have two terminals and can be connected with a first terminal to the second rectifying electrode of the second transistor and can be connected with a second terminal to the first terminal of the series connection.

A first ohmic resistor can have two terminals and can be connected with a first terminal to the first side of the first power capacitor and to the first rectifying electrode of the first switching transistor and can be connected with a second terminal to the second rectifying electrode of the second transistor. A second ohmic resistor can have two terminals and can be connected with a first terminal to the first side of the second power capacitor and to the first rectifying electrode of the second switching transistor and can be connected with a second terminal to the second rectifying electrode of the first transistor. The two ohmic resistors can be provided for the purpose of building up oscillations of the multivibrator circuit. A third diode can have two terminals and can be connected with a first terminal to the first rectifying electrode of the first transistor and can be connected with a second terminal to the first terminal of the series connection. A fourth diode can have two terminals and can be connected with a first terminal to the first rectifying electrode of the second transistor and can be connected with a second terminal to the first terminal of the series connection.

A third transformer winding can be coupled inductively to the first transformer winding for decoupling a power output from the multivibrator circuit. A fourth transformer winding can be coupled inductively to the first transformer winding for decoupling a power output from the multivibrator circuit.

A control circuit can be connected to terminals of the control winding for providing a control signal to the control winding.

The uniformity of the curvature of the course of the magnetic flux versus magnetic field curve can be such that it does not deviate by more than 5 percent on each side from the constant curvature of a circle section. The uniformity of the curvature of the course of the magnetic flux versus magnetic field curve can be such that it does not deviate by more than 1 percent on each side from a cone section having an eccentricity of less than 0.05 versus a constant curvature of a related circle section of a cone. The uniformity of the curvature of the course of the magnetic flux versus magnetic field curve is such that it does not deviate by more than 2 percent on each side from a cone section having an eccentricity of less than 0.1 versus a constant curvature of a related circle section. The uniformity of the curvature of the course of the magnetic flux versus magnetic field curve can be such that it does not deviate by more than 2 percent on each side from a cone section having an eccentricity of less than 0.1 versus a constant curvature of a related circle section. The arc of the approximating circle section can be at least about 80 degrees in order to provide for a slope ratio of 1:100. The uniformity of the curvature of the course of the magnetic flux versus magnetic field curve can be of such uniformity that it does not deviate by more than 5 percent on each side from the constant curvature of an circle section. The arc of the approximating circle section can be at least about 80 degrees in order to provide for a slope ratio of 1:100.

A material forming the ferromagnetic core can have a retentivity of less than 10,000 Gauss. A material forming the ferromagnetic core can be of amorphous structure. A material forming the ferromagnetic core has a coercitivity of less than 0.5 Gauss.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
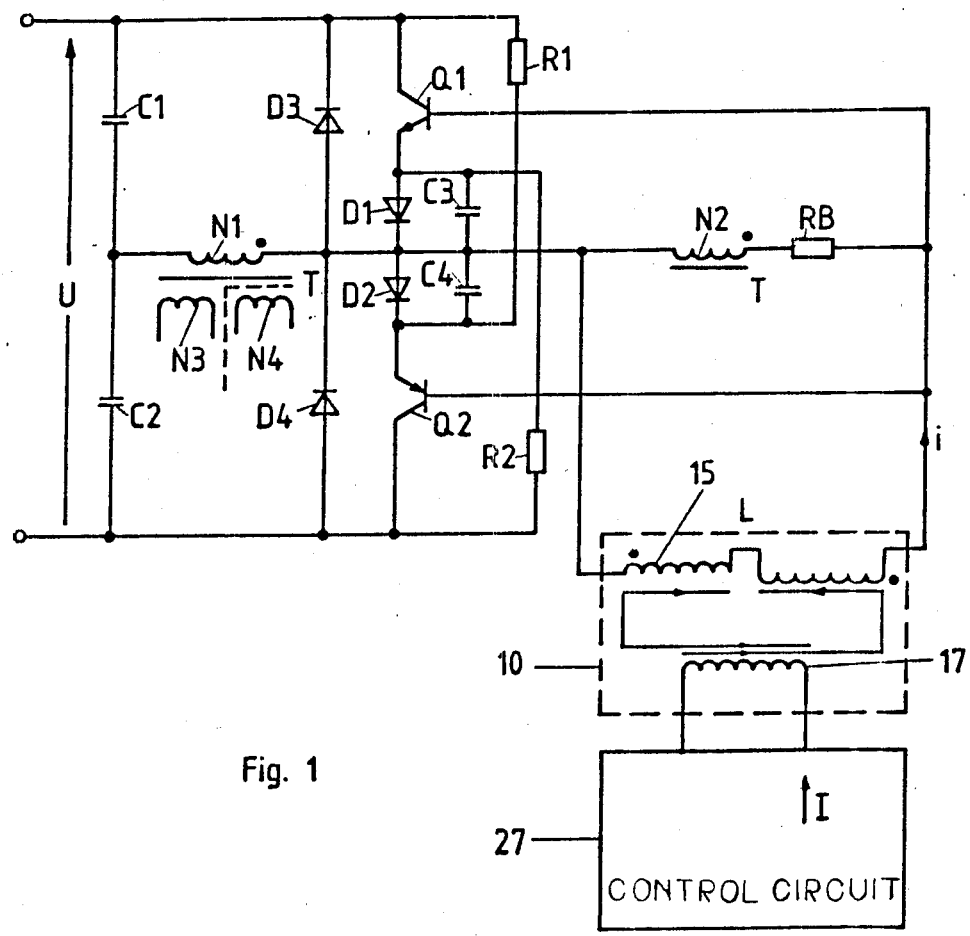
FIG. 1 is a schematic circuit diagram for an astable magnetically coupled multivibrator circuit.

In accordance with the present invention, there is provided an astable, magnetically coupled multivibrator with two power capacitors (C1, C2). The two power capacitors (C1, C2) are connected in series to an input voltage (U), and the two power capacitors (C1, C2) can be alternatingly shorted by two switching transistors (Q1, Q2) and via a transformer winding (N1). A positive feedback is provided which comprises a second transformer winding (N2), an ohmic resistor (RB) and an inductor connected in parallel to the ohmic resistor (RB) for setting the frequency of the multivibrator. The improvement comprises that the inductor is an electronic component (10) with a variable inductivity (L) which can be controlled by a control current (I). The electronic component (10) is constructed of two ferromagnetic cores (11, 12). The ferromagnetic cores are independent of each other, of the same construction, are coaxially disposed and are ring-shaped and closed each core in itself. A control winding (17) surrounds the two cores jointly. An induction winding (15) individually in each case surrounds the two cores (11, 12) and the induction winding is formed as two partial windings (15.1, 15.2). The winding sense of the windings (17, 15.1, 15.2) is directed such that the magnetic fluxes generated by the currents (I, i) through the windings (17, 15.1, 15.2) in the cores (11, 12) and that the currents in the other one of the cores (for example 12) are directed oppositely.

The functional dependence of the magnetic flux density (B) on the magnetic field strength (H) at the core material exhibits a course, which course, over its full range, is of about a uniform curvature and which does not exhibit a saturation bend. The core corresponds to that of a soft magnetic material and which course is therefore substantially identical for rising and for falling field strength (H), and where there are two magnetic field strength values such that the ratios of the slope of the course varies is at least 1:100.

The electronic component (10) is connected with its induction winding (15) in parallel to the series connection of the second transformer winding (N2) and of the ohmic resistor (RB).

Alternatively, the electronic component is connected in parallel with its induction winding (15) to the series connection of the first transformer winding (N1), of the second transformer winding (N2), and of the ohmic resistor (RB).

Two ohmic resistors (R1, R2) are provided for the purpose of building up oscillations of the multivibrator, The ohmic resistors are connected in series to the input voltage (U) via the emitter base sequence of the two switching transistors (Q1, Q2). Two capacitors (C1, C2) are provided and two diodes (D1, D2) are provided. The diodes (D1, D2) are connected in parallel to the two capacitors (C1, C2) and the diodes connect the emitters of these two transistors (Q1, Q2) to each other.

Referring now to FIG. 1, there is shown the circuit diagram of an astable magnetically coupled multivibrator. This multivibrator contains, in the power part, capacitors C1 and C2 with equal and constant capacity. The multivibrator further comprises a primary winding N1 of a decoupling and feedback coupling transformer T. The input voltage U is applied to the two power capacitors C1 and C2. Two switching transistors Q1 (npn type) and Q2 (pnp type) serve as active switching elements. The two switching transistors Q1 and Q2 are connected in series with two diodes D1, D2, and the operation of the diodes D1 and D2 is further improved by the presence of two additional diodes D3 and D4.

The positive feedback of the multivibrator is performed via the winding N2 of the transformer T. An ohmic base resistor RB follows in series to the winding N2. The ohmic base resistor RB is connected with one pole to the base of the two transistors Q1 and Q2. An electrically controllable inductive component 10 is connected in parallel to the winding N2 and to the base resistor RB. The component 10 is activated and controlled via a control circuit 27 providing a current I.

The circuit is further completed by two resistors R1 and R2 and by two capacitors C3 and C4 for initiating the oscillation. The decoupling of the power output of the multivibrator is performed via one or two additional transformer windings N3, N4.

This multivibrator oscillates with a frequency which is determined by the voltage induced in the winding N2 and by the currents flowing thereby through the base resistor RB and through the induction winding 15 of the component 10. The current i through the induction winding 15 increases based on the variable inductivity L of the component 10, in each case more or less quickly adjustable, and requires thus in each case a controllable time until it is of such size that, in each case, the conducting transistor Q1 or, respectively, Q2 becomes nonconducting and locking and that, in each case, the nonconducting transistor Q1 or, respectively, Q2 becomes conducting, that is, the switching circuit switches. By varying the inductivity L of the component 10, the frequency can be changed, controlled, or automatically controlled. It is advantageous in this context if the inductivity L can be varied over a wide range, for example in a range of 1:100, and if the inductivity acts in each case as a conventional throttling coil or choke would operate with, in each case, an equal inductivity value, that is if the inductivity depend in a linear manner on a current.

Figure 2:
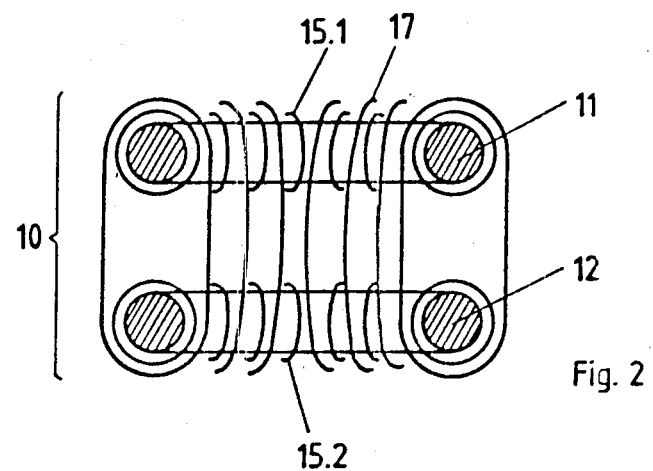
FIG. 2 illustrates schematically the construction of an electrically controllable inductive component.
Figure 3:
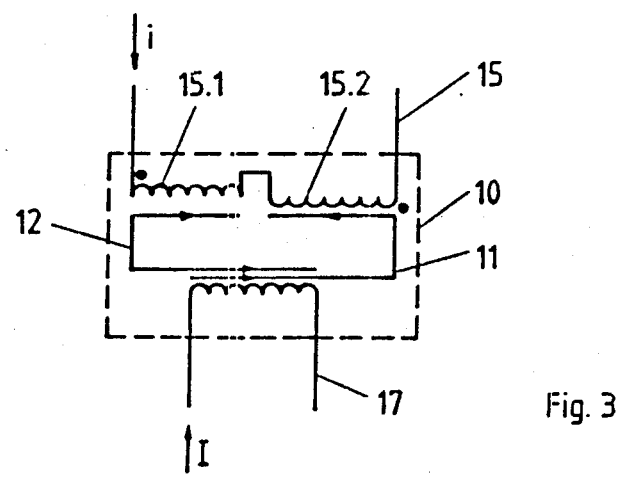
FIG. 3 is a schematic view of a symbolic representation of the component.

A new component 10 is described in the following, which exhibits these properties. The construction of the element 10 is illustrated in FIG. 2, and FIG. 3 provides a symbolic representation. The component 10 comprises two identical ferromagnetic, high-frequency-suitable, coaxially disposed, cylindrical, or preferably toroidal annular cores 11, 12 and, in particular, ferrite cores, which are illustrated in a sectional view in FIG. 3. Each of the cores is wound substantially over its full angular region uniformly with a partial winding 15.1 or, respectively, 15.2 of equal winding number. These partial windings have opposite senses of winding direction and form an induction winding 15 when coomponent 10 comprises two identical ferromagnetic, high-frequency-suitable, coaxially disposed, cylindrical, or preferably toroidal annular cores 11, 12 and, in particular, ferrite cores, which are illustrated in a sectional view in FIG. 3. Each of the cores is wound substantially over its full angular region uniformly with a partial winding 15.1 or, respectively, 15.2 of equal winding number. These partial windings have opposite senses of winding direction and form an induction winding 15 when connected in series. The induction winding 15 is passed through by the current i to be influenced and controlled. For this purpose, a control winding 17 is added, where the control winding 17 is wound in a second operational step jointly over the coaxially integrated cores 11, 12 and their partial windings 15.1, 15.2. The control winding 17 is also wound uniformly over the full angular region and thereby provides the side effect of mechanically maintaining the cores 11 and 12 in an integrated position. The control winding 17 is passed by the recited control current I. A unique coordinating inductivity value L is set for the induction winding 15 depending on, in each case, the coordinated and equal premagnetization of the ring cores 11 and 12. Based on the recited geometry of the inductive component 10, the inductivity for alternating and time-dependent current with a corresponding voltage of a value which is not too high is maintained constant, this means that the component behaves always as one of the recited conventional throttle coils with an inductivity value L corresponding in each case.

The physical reason for the recited behavior of the new component 10 is found in the recited parent applications. Therefore, these recited parent applications are expressly included in the instant disclosure instead of a long-winding and repetitious reciting of the contents of these parent applications. It is to be mentioned, however, that the functional dependency of the magnetic flux density B on the magnetic field strength H exhibits a course at the core material, which is about uniformly curved over the full range and which is without a saturation bend, which is soft magnetic and thus substantially identical for increasing and for decreasing field strength H and where the slope varies at least in a ratio of 1:100.

The resistors R1 and R2 are disposed such in series with the two base emitter sections of the two transistors Q1 and Q2 upon starting of the multivibrator, that is upon application of the input voltage U, that a current is flowing. Thereby and with cooperation of the capacitors C3, C4 and of the diodes D1, D2, there is created an imbalance, by way of which one of the two transistors moves into the blocking state and the other transistor moves into the open state which again starts to bring the multivibrator as a whole into an oscillating state.

The use of the component 10 in a multivibrator according to FIG. 1 is associated mainly with a substantial improvement of the control and automatic control properties of the multivibrator as well as with an enlargement of the control region, with an insensitivity against electrical and mechanical disturbances, with toughness but, in addition, with an improvement in the cost situation based on the simplicity of construction of the component 10. The build-up behavior of the multivibrator is very good and occurs already with a voltage U which is near 1 to a few volts, which is very important for example in case a battery operation is desired.

The induction winding 15 of the component 10, instead of being connected only parallel relative to the transformer winding N2 and the base resistor R2, can also be connected parallel to the primary winding N1 of the transformer T. In this case, there results a coupling of the connection point of the two capacitors C1, C2 with the bases of the transistors Q1, Q2. Of course, there is required a correspondingly adapted dimensioning of the full circuit.

It will be understood that each of the elements described above, or two or more together, may also find a useful application in other types of multivibrator system configurations and oscillator procedures differing from the types described above.

While the invention has been illustrated and described as embodied in the context of an oscillating multivibrator, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. An astable, magnetically coupled multivibrator circuit comprising
   a first power input terminal;
   a second power input terminal;
   a first power capacitor connected on one side to the first power input terminal;
   a second power capacitor connected on one side to the second power input terminal and connected on a second side to a second side of the first power capacitor;
   a first switching transistor having two rectifying electrodes including emitter and collector and having a base where a first rectifying electrode of the first switching transistor is connected to the first side of the first power capacitor;
   a second switching transistor having two rectifying electrodes including emitter and collector and having a base where a first rectifying electrode of the second switching transistor is connected to the first side of the second power capacitor;

a first transformer winding connected at a first end to the second side of the first power capacitor and to the second side of the second power capacitor and connected at a second end to a second rectifying electrode of the first switching transistor and to a second rectifying electrode of the second switching transistor;

a series connection of an ohmic resistance and of a second transformer winding connected at a first end to the second rectifying electrode of the first switching transistor and to the second rectifying electrode of the second switching transistor and connected at a second end to the base of the first switching transistor and to a base of the second switching transistor;

a current controlled inductor connected in parallel to the series connection for setting the frequency of the multivibrator, where the inductor is an electronic component which can be controlled by a control current and which inductor comprises two ferromagnetic cores, which two ferromagnetic cores are independent of each other, which two ferromagnetic cores have the same properties and are disposed coaxially relative to each other and are formed as a ring each closed in itself, a control winding which winds around the two ferromagnetic cores jointly, and an induction winding, which forms two partial windings connected in series and which winds around the two ferromagnetic cores in each case separately, where the sense of direction of the control winding and of the partial windings is such that currents passing through the control winding and the partial windings generate magnetic fluxes in the cores such that the magnetic fluxes are of the same direction in one of the cores and in opposite direction in a second one of the ferromagnetic cores, where the functional dependence of a magnetic flux density in a core on the magnetic field strength in that core exhibits a course for the core material employed, which course exhibits, over its full region, an about uniform curvature and no saturation bend, where the core is of a soft magnetic material and thereby a course is present which is substantially identical for increasing and decreasing field strength, and where there are two magnetic field strength values such that the ratios of the slope of the course are at least 1 to 100.

2. The multivibrator circuit according to claim 1, where the induction winding is connected in parallel to the series connection of the second transformer winding and of the ohmic resistance.

3. The multivibrator circuit according to claim 1 where the electronic component with its induction winding is connected in parallel to the series connection of the first transformer winding, of the second transformer winding, and of the ohmic resistor.

4. The multivibrator circuit according to claim 1 further comprising
a first ohmic resistor having two terminals and connected with a first terminal to the first side of the first power capacitor and to the first rectifying electrode of the first switching transistor;
a second ohmic resistor having two terminals and connected with a first terminal to the first side of the second power capacitor and to the first rectifying electrode of the second switching transistor, where the two ohmic resistors are provided for the purpose of building up oscillations of the multivibrator circuit and which ohmic resistors are connected in series to the input voltage via the emitter base sequence of the two switching transistors; and
a first diode; and
a second diode where the first and second diode are connected in parallel to the first and second capacitor and which diodes connect the emitters of these two transistors to each other.

5. The multivibrator circuit according to claim 1 further comprising
a first ohmic resistor having two terminals and connected with a first terminal to the first side of the first power capacitor and to the first rectifying electrode of the first switching transistor;
a second ohmic resistor having two terminals and connected with a first terminal to the first side of the second power capacitor and to the first rectifying electrode of the second switching transistor, where the two ohmic resistors are provided for the purpose of building up oscillations of the multivibrator circuit and which ohmic resistors are connected in series to the input voltage via the emitter base sequence of the two switching transistors; and
a first diode having two terminals and connected with a first terminal to the second rectifying electrode of the first transistor and connected with a second terminal to the first terminal of the series connection;
a second diode having two terminals and connected with a first terminal to the second rectifying electrode of the first transistor and connected with a second terminal to the first terminal of the series connection.

6. The multivibrator circuit according to claim 1 further comprising
a first ohmic resistor having two terminals and connected with a first terminal to the first side of the first power capacitor and to the first rectifying electrode of the first switching transistor and connected with a second terminal to the second rectifying electrode of the second transistor;
a second ohmic resistor having two terminals and connected with a first terminal to the first side of the second power capacitor and to the first rectifying electrode of the second switching transistor and connected with a second terminal to the second rectifying electrode of the first transistor, where the two ohmic resistors are provided for the purpose of building up oscillations of the multivibrator circuit;
a first diode having two terminals and connected with a first terminal to the second rectifying electrode of the first transistor and connected with a second terminal to the first terminal of the series connection;
a second diode having two terminals and connected with a first terminal to the second rectifying electrode of the first transistor and connected with a second terminal to the first terminal of the series connection.

7. The multivibrator circuit according to claim 1 further comprising
a first ohmic resistor having two terminals and connected with a first terminal to the first side of the first power capacitor and to the first rectifying electrode of the first switching transistor and connected with a second terminal to the second rectifying electrode of the second transistor;

a second ohmic resistor having two terminals and connected with a first terminal to the first side of the second power capacitor and to the first rectifying electrode of the second switching transistor and connected with a second terminal to the second rectifying electrode of the first transistor, where the two ohmic resistors are provided for the purpose of building up oscillations of the multivibrator circuit;

a third capacitor having two terminals and connected with a first terminal to the second rectifying electrode of the first transistor and connected with a second terminal to the first terminal of the series connection;

a fourth capacitor having two terminals and connected with a first terminal to the second rectifying electrode of the second transistor and connected with a second terminal to the first terminal of the series connection.

8. The multivibrator circuit according to claim 1 further comprising a first ohmic resistor having two terminals and connected with a first terminal to the first side of the first power capacitor and to the first rectifying electrode of the first switching transistor and connected with a second terminal to the second rectifying electrode of the second transistor;

a second ohmic resistor having two terminals and connected with a first terminal to the first side of the second power capacitor and to the first rectifying electrode of the second switching transistor and connected with a second terminal to the second rectifying electrode of the first transistor, where the two ohmic resistors are provided for the purpose of building up oscillations of the multivibrator circuit;

a third diode having two terminals and connected with a first terminal to the first rectifying electrode of the first transistor and connected with a second terminal to the first terminal of the series connection;

a fourth diode having two terminals and connected with a first terminal to the first rectifying electrode of the second transistor and connected with a second terminal to the first terminal of the series connection.

9. The multivibrator circuit according to claim 1 further comprising a third transformer winding inductively coupled to the first transformer winding for decoupling a power output from the multivibrator circuit.

10. The multivibrator circuit according to claim 9 further comprising a fourth transformer winding inductively coupled to the first transformer winding for decoupling a power output from the multivibrator circuit.

11. The multivibrator circuit according to claim 1 further comprising a control circuit connected to terminals of the control winding for providing a control signal to the control winding.

12. The multivibrator circuit according to claim 1 wherein the uniformity of the curvature of the course of the magnetic flux versus magnetic field curve is such that it does not deviate by more than 5 percent on each side from the constant curvature of a circle section.

13. The multivibrator circuit according to claim 1 wherein the uniformity of the curvature of the course of the magnetic flux versus magnetic field curve is such that it does not deviate by more than 1 percent on each side from a cone section having an eccentricity of less than 0.05 versus a constant curvature of a related circle section.

14. The multivibrator circuit according to claim 1 wherein the uniformity of the curvature of the course of the magnetic flux versus magnetic field curve is such that it does not deviate by more than 2 percent on each side from a cone section having an eccentricity of less than 0.1 versus a constant curvature of a related circle section and wherein a material forming the ferromagnetic core is of amorphous structure.

15. The multivibrator circuit according to claim 1 wherein the uniformity of the curvature of the course of the magnetic flux versus magnetic field curve is such that it does not deviate by more than 2 percent on each side from a cone section having an eccentricity of less than 0.1 versus a constant curvature of a related circle section and where the arc of the approximating circle section is at least about 80 degrees in order to provide for a slope ratio of 1:100 and wherein a material forming the ferromagnetic core has a retentivity of less than 10,000 Gauss.

16. The multivibrator circuit according to claim 1 wherein the uniformity of the curvature of the course of the magnetic flux versus magnetic field curve is of such uniformity that it does not deviate by more than 5 percent on each side from the constant curvature of an circle section and where the arc of the approximating circle section is at least about 80 degrees in order to provide for a slope ratio of 1:100 and wherein a material forming the ferromagnetic core has a coercitivity of less than 0.5 Gauss.

17. An astable, magnetically coupled multivibrator with two power capacitors (C1, C2), which are connected in series to an input voltage (U), and which two power capacitors (C1, C2) can be alternatingly shorted by two switching transistors (Q1, Q2) and via a transformer winding (N1);

where a positive feedback is provided which comprises a second transformer winding (N2), an ohmic resistor (RB) and an inductor connected in parallel to the ohmic resistor (RB) for setting the frequency of the multivibrator;

wherein the improvement comprises that the inductor is an electronic component (10) with a variable inductivity (L) which can be controlled by a control current (I), which electronic component (10) is constructed of two ferromagnetic cores (11, 12), which cores are independent of each other, of the same construction, and which cores are coaxially disposed and which are ring-shaped and closed each in itself; of a control winding (17) which surrounds the two cores jointly; and of an induction winding (15), which individually in each case surrounds the two cores (11, 12) and is formed as two partial windings (15.1, 15.2);

where the winding sense of the windings (17, 15.1, 15.2) is directed such that the magnetic fluxes generated by the currents (I, i) through the windings (17, 15.1, 15.2) in the cores (11, 12) and that the currents in the other one of the cores (for example 12) are directed oppositely; and where the functional dependence of the magnetic flux density (B) on the magnetic field strength (H) at the core material exhibits a course, which course, over its full range, is of about a uniform curvature and which does not exhibit a saturation bend, which course corresponds to that of a soft magnetic material and which course is therefore substantially identical for rising and for falling field strength (H), and where there are two magnetic field strength values such that the ratios of the slope of the course are at least a ratio of 1:100.

18. The multivibrator according to claim 17, characterized in that the electronic component (10) is connected with its induction winding (15) in parallel to the series connection of the second transformer winding (N2) and of the ohmic resistance (RB).

19. The multivibrator according to claim 17, characterized in that the electronic component is connected in parallel with its induction winding (15) to the series connection of the first transformer winding (N1), of the second transformer winding (N2), and of the ohmic resistor (RB).

20. The multivibrator according to claim 17, characterized in that two ohmic resistors (R1, R2) are provided for the purpose of building up oscillations of the multivibrator, which ohmic resistors are connected in series to the input voltage (U) via the emitter base sequence of the two switching transistors (Q1, Q2), and where two capacitors (C1, C2) are provided and two diodes (D1, D2) are provided, which diodes (D1, D2) are connected in parallel to the two capacitors (C1, C2) and which diodes connect the emitters of these two transistors (Q1, Q2) to each other.

* * * * *